(12) United States Patent
Yoon

(10) Patent No.: US 7,846,850 B2
(45) Date of Patent: Dec. 7, 2010

(54) METHOD OF FABRICATING INSULATION LAYER AND METHOD OF FABRICATING SEMICONDUCTOR DEVICE USING THE SAME

(75) Inventor: Yang-Han Yoon, Icheon-si (KR)

(73) Assignee: Hynix Semiconductor Inc., Icheon-Si, Gyeonggi-Do (KR)

( * ) Notice: Subject to any disclaimer, the term of this patent is extended or adjusted under 35 U.S.C. 154(b) by 45 days.

(21) Appl. No.: 12/346,691

(22) Filed: Dec. 30, 2008

(65) Prior Publication Data

US 2010/0151668 A1   Jun. 17, 2010

(30) Foreign Application Priority Data

Dec. 16, 2008   (KR) .................... 10-2008-0127723

(51) Int. Cl.
*H01L 21/31* (2006.01)

(52) U.S. Cl. .............................. 438/761; 257/E21.275

(58) Field of Classification Search ................ 438/588, 438/761, 778; 257/E21.275
See application file for complete search history.

(56) References Cited

U.S. PATENT DOCUMENTS

| | | | |
|---|---|---|---|
| 6,613,657 B1 * | 9/2003 | Ngo et al. | 438/588 |
| 6,734,108 B1 * | 5/2004 | Jin et al. | 438/700 |
| 7,074,701 B2 * | 7/2006 | Cheng et al. | 438/597 |

* cited by examiner

*Primary Examiner*—Quoc D Hoang
(74) *Attorney, Agent, or Firm*—Lowe Hauptman Ham & Berner LLP

(57) ABSTRACT

A method for fabricating an insulation layer includes forming an insulation layer over a nitride layer using a silicon source and a phosphorus source, wherein the insulation layer includes a first insulation layer contacting the nitride layer and a second insulation layer formed on the first insulation layer, wherein the first insulation layer is formed using a higher flow rate of the silicon source and a lower flow rate of the phosphorus source than used with the second insulation layer.

23 Claims, 12 Drawing Sheets

METHOD OF FABRICATING INSULATION LAYER AND METHOD OF FABRICATING SEMICONDUCTOR DEVICE USING THE SAME

CROSS-REFERENCE TO RELATED APPLICATIONS

The present application claims priority of Korean patent application number 10-2008-0127723, filed on Dec. 16, 2008, which is incorporated herein by reference in its entirety

BACKGROUND

The present disclosure relates to a semiconductor fabrication technology, and more particularly, to a method for fabricating an insulation layer, which is capable of preventing a nitride layer from being lost to a phosphorus-containing insulation layer, and a method for fabricating a semiconductor device using the same.

As a semiconductor device becomes more highly integrated, the circuit pattern sizes/dimensions are reduced, and the aspect ratio between the patterns is increased. Thus, the margin of gap-fill processes is reduced. Therefore, insulation layers such as a borophospho silicate glass (BPSG) which have appropriate reflow characteristics, are used as an inter-layer dielectric layer filling the gaps between the patterns. If a thermal treatment is performed on a deposited BPSG layer, a reflow occurs in the BPSG layer. Thus, flatness can be ensured and inter-layer defects such as void can be removed.

FIG. 1 is a cross-sectional view of a typical semiconductor device including an interlay dielectric layer, and FIGS. 2A and 2B are cross-sectional views for explaining limitations encountered with the typical semiconductor device.

Referring to FIG. 1, a plurality of gates 105 are arranged over a substrate 101 such that a gap between the gates 105 is smaller in a cell region than in a peripheral region (S1<S2), and a gate spacer layer 106 is formed on both sidewalls of the gate 105. A nitride layer 108 is disposed along the surface of a resulting structure including the gates 105, and a BPSG layer 107 is formed on the nitride layer 108 as an interlayer dielectric layer filling the gap between the gates 105. The gate has a stacked structure in which a gate dielectric layer 102, a gate electrode 103, and a gate hard mask layer 104 are sequentially formed.

The nitride layer 108 prevents impurities (for example, phosphorus (P) and boron (B)) contained in the BPSG layer 107 from penetrating into the substrate 101 or the gates 105, and protects the lower structure.

However, during a reflow thermal treatment for removing defects such as voids in the BPSG layer 107 and stepped surface, a loss of nitride layer 108 is caused by the BPSG layer 107, thus degrading characteristics of the semiconductor device. This is because phosphorus (P) in the BPSG layer 107 reacts with water ($H_2O$) in the atmosphere to form a phosphoric acid which will etch the nitride layer 108.

Also, since the nitride layer 108 is formed in the cell region and the peripheral region at the same time, the nitride layer 108 has an equal thickness in the cell region and in the peripheral region, but loss degrees of the nitride layer 108, which are derived from the BPSG layer 107, are different due to the gap difference between the gates 105 in the cell region and the peripheral region. Since an amount of the BPSG layer 107 filled between the gates 105 in the cell region is larger than that filled between the gates 105 of the peripheral region, the amount of loss of the nitride layer 108 formed in the peripheral region is larger than that of the nitride layer 108 formed in the cell region. Therefore, the thickness of the nitride layer 108 remaining after the reflow thermal treatment of the BPSG layer 107 is larger in the cell region than in the peripheral region (T1>T2). The difference in the loss amount of the nitride layer 108 due to the gap difference of the gates 105 degrades the characteristics of the semiconductor device, which will be described below in detail with reference to FIGS. 2A and 2B.

FIG. 2A is a cross-sectional view illustrating a case where the thickness of the nitride layer 108 remaining after the reflow thermal treatment of the BPSG layer 107 is suitable for the cell region. In this case, the nitride layer 108 formed in the peripheral region is excessively lost. When the nitride layer 107 is excessively lost, in particular, when the thickness of the remaining nitride layer 108 is less than 55 Å, impurities contained in the BPSG layer 107, especially boron (B), penetrate into the substrate 101 or the gates 105, degrading the characteristics of the semiconductor device.

FIG. 2B is a cross-sectional view illustrating a case where the thickness of the nitride layer 108 remaining after the reflow thermal treatment of the BPSG layer 107 is suitable for the peripheral region, that is, the thickness of the nitride layer 108 remaining in the peripheral region is greater than at least 55 Å. In this case, the nitride layer 108 which remains in the cell region is thicker than actually necessary. Thus, the nitride layer 108 is left on the substrate 101 in a process of forming a contact hole 109 for a landing plug, which will cause a contact-not-open phenomenon.

SUMMARY

Embodiments are directed to provide a method for fabricating an insulation layer, which is capable of preventing or suppressing a nitride layer from being lost due to the presence of a phosphorus-containing insulation layer and ensuring desirable reflow characteristics, and a method for fabricating a semiconductor device using the same.

Embodiments are directed to provide a method for fabricating a semiconductor device, in which the loss amount of a nitride layer to an interlayer dielectric layer is uniform in a cell region and a peripheral region irrespective of gaps between gates being different, thereby preventing a contact-not-open phenomenon in the cell region and preventing impurities contained in the interlayer dielectric layer of the peripheral region from penetrating into a substrate or gates.

In accordance with one aspect of the disclosed subject matter, there is provided a method for fabricating an insulation layer, the method comprising: forming an insulation layer over a nitride layer by using a silicon source and a phosphorus source, wherein the insulation layer includes a first insulation layer contacting the nitride layer and a second insulation layer formed on the first insulation layer, wherein the first insulation layer is formed using a higher silicon source flow rate and a lower phosphorous source flow rate than used with a second insulation layer.

In accordance with another aspect, there is provided a method for fabricating a semiconductor device, the method including: forming a plurality of patterns over a substrate so as to have a certain gap therebetween; forming a nitride layer over a resulting structure including the patterns Additionally this aspect includes forming a first insulation layer having an uniform thickness over the nitride layer, and a second insulation layer filling a gap between the patterns over the first insulation layer, wherein the first and second insulation layers are formed using a silicon source and a phosphorus source, the first insulation layer being formed by using a higher flow rate of the silicon source and a lower flow rate of the phosphorus source than used to form the second insulation layer.

In accordance with yet another aspect of the disclosed subject matter, there is provided a method for fabricating a semiconductor device, the method including: forming a plurality of gates over a substrate defining a cell region and a peripheral region, a gap between the gates in the cell region being less than a gap between the gates in the peripheral region; forming a nitride layer over a resulting structure including the gates; and forming a first insulation layer having an uniform thickness over the nitride layer, and a second insulation layer filling a gap between the gates over the first insulation layer. In this instance the first and second insulation layers are formed using a silicon source and a phosphorus source, the first insulation layer being formed by using a higher flow rate of the silicon source and a lower flow rate of the phosphorus source than used with the formation of the second insulation layer.

In accordance with a still further aspect of the disclosed subject matter a method for fabricating a semiconductor device which includes forming a plurality of gates over a substrate defining a cell region and a peripheral region, a gap between the gates in the cell region being less than a gap between the gates in the peripheral region; forming a nitride layer over a resulting structure including the gates; forming a first insulation layer having an uniform thickness over the nitride layer using a silicon source flow rate which is higher than a phosphorous flow rate so that the first insulation layer has a first silicon to phosphorus percentage range; forming a second insulation layer filling a gap between the gates over the first insulation layer using a silicon flow rate which is lower than a phosphorous flow rate wherein the second insulation layer has a second silicon to phosphorous percentage range; and performing thermal reflow of the second insulation layer in a manner wherein an amount of the nitride layer between the gates of the cell region is which is lost via the first insulation layer during the reflow, matches an amount of the nitride layer lost between the cells of the peripheral region in a manner wherein a thickness of the nitride layer between the gates of the cell region is essentially the same as the thickness of the nitride layer between the gates in the peripheral region when the thermal reflow is completed.

DESCRIPTION OF EMBODIMENTS

Other objects and advantages of the disclosed subject matter will become better understood from the following description of the embodiments.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

The disclosed embodiments relate to a method for fabricating an insulation layer, which is capable of optimally preventing or suppressing loss of a nitride layer due to the presence of a phosphorus-containing layer, for example, a BPSG layer, while ensuring appropriate reflow characteristics, and a method for fabricating a semiconductor device using the same. To this end, when forming the insulation layer on the nitride layer using a silicon source and a phosphorus source, a first insulation layer contacting the nitride layer is formed using a larger flow rate of the silicon source than a second insulation layer formed on the first insulation layer and a smaller flow rate of the phosphorus source than used with the formation of the second insulation layer.

One Embodiment

FIGS. 3A to 3D are cross-sectional views illustrating a method for fabricating a semiconductor device in accordance with one embodiment.

Figure 1:
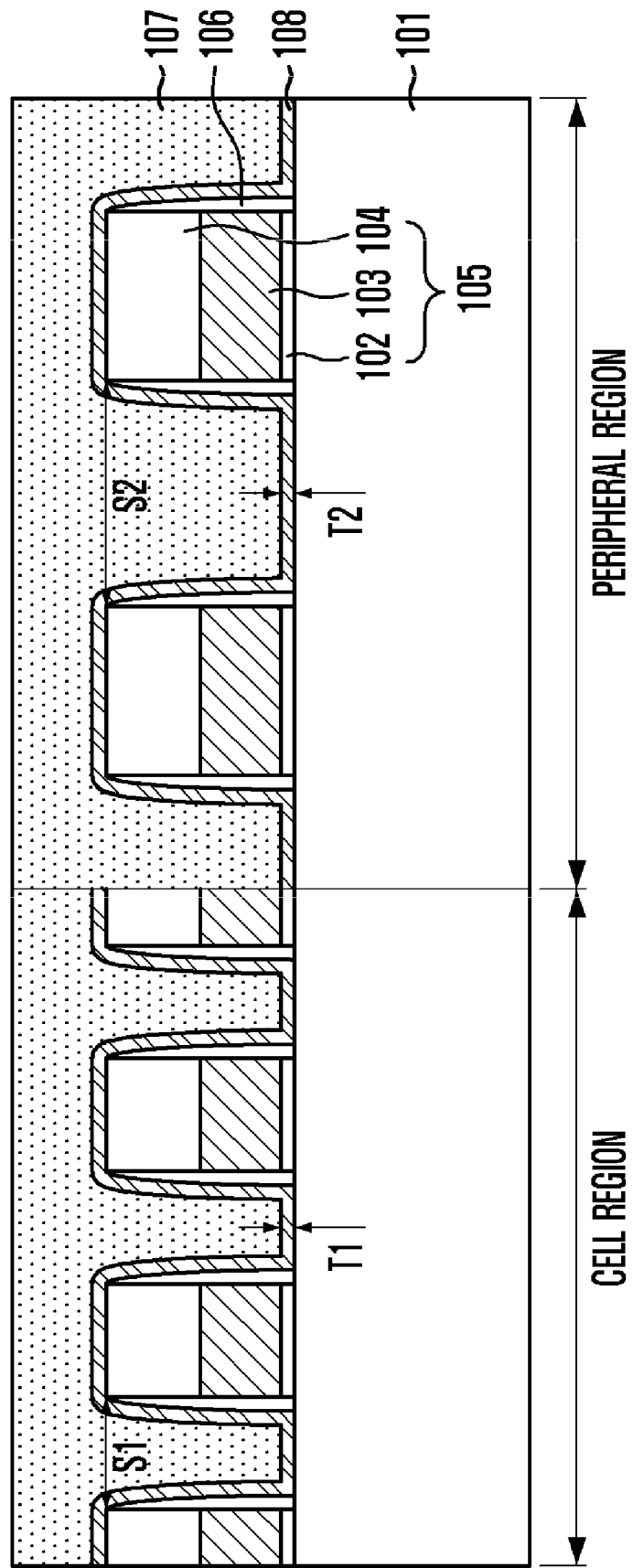
FIG. 1 is a cross-sectional view of a typical semiconductor device including an interlay dielectric layer.
Figure 2A:
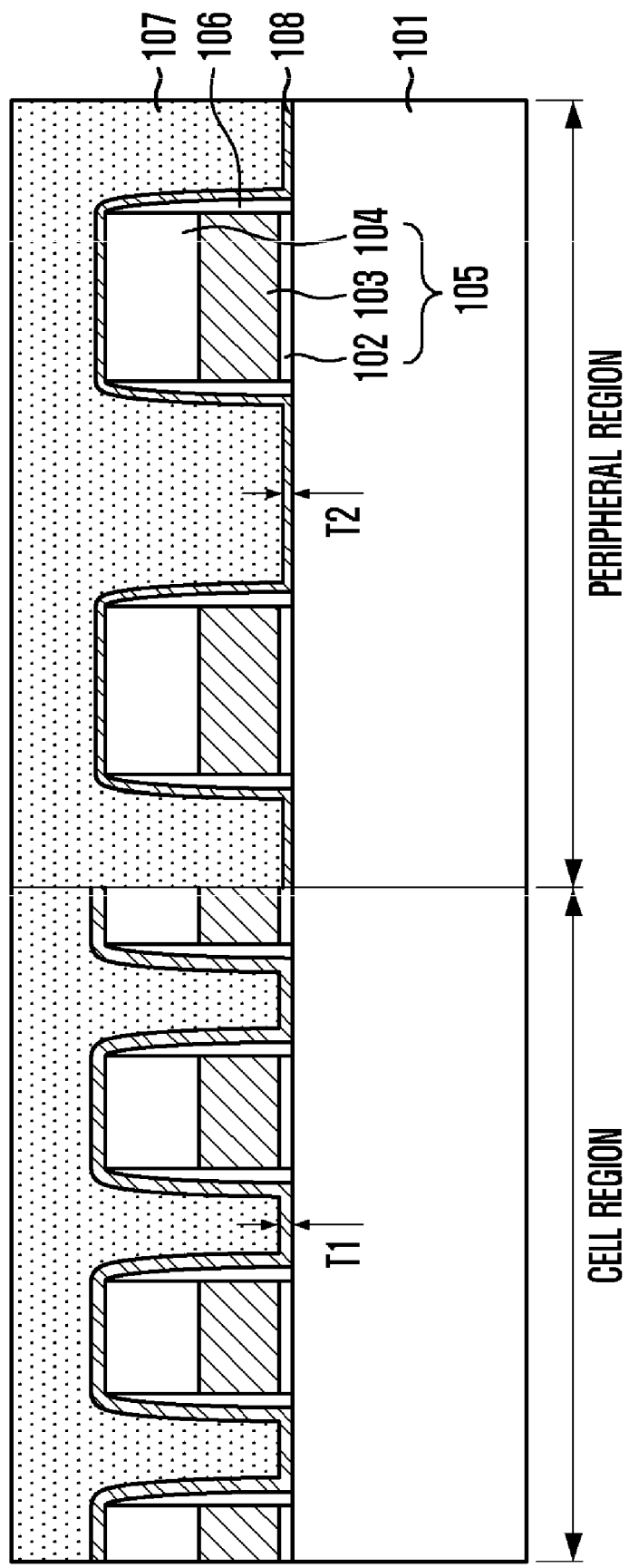
FIGS. 2A and 2B are cross-sectional views explaining limitations encountered with the typical semiconductor device.
Figure 2B:
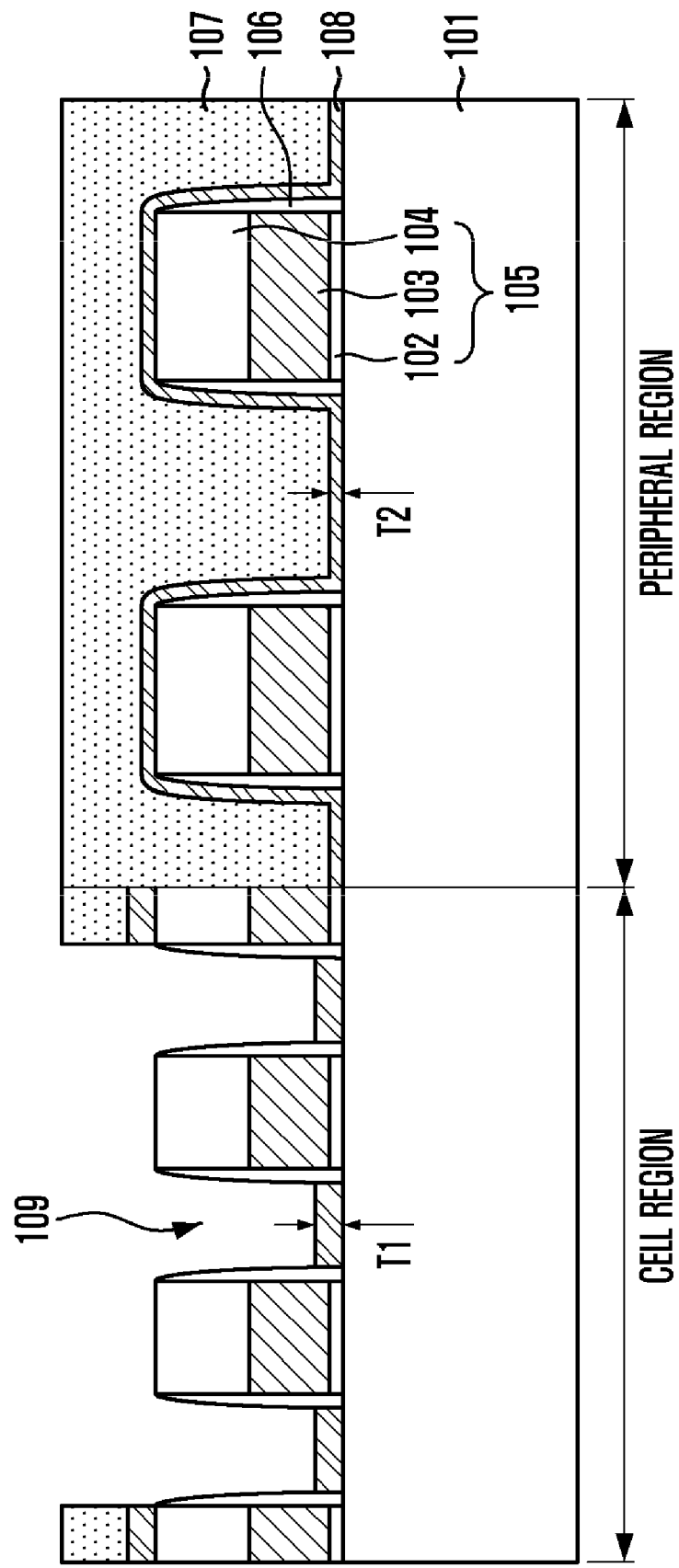
Figure 3A:
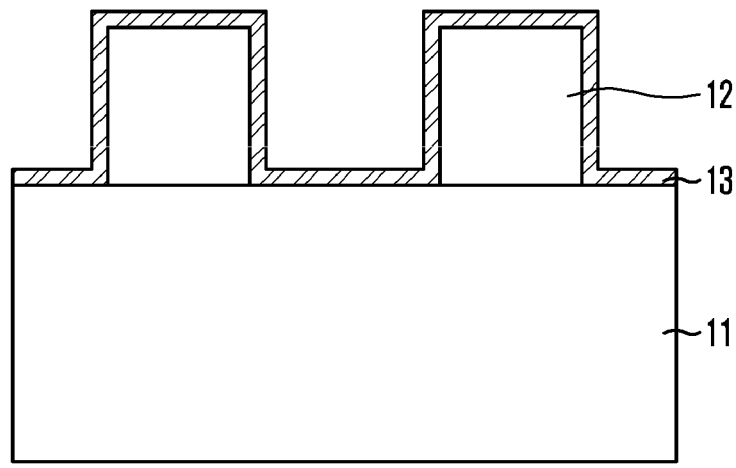
FIGS. 3A to 3D are cross-sectional views illustrating a method of fabricating a semiconductor device in accordance with one embodiment.

Referring to FIG. 3A, a plurality of patterns 12 having a certain gap are formed over a substrate 11 where a predetermined structure is formed. The patterns 12 may include a gate, a bit line, and a metal line.

A nitride layer 13 is formed over a resulting structure including the patterns 12. The nitride layer 13 prevents impurities contained in an interlayer dielectric layer from penetrating into the substrate 11 or the patterns 12 in a subsequent process of forming the interlayer dielectric layer. The nitride layer 13 may be formed of silicon nitride ($Si_3N_4$).

The deposited thickness of the nitride layer 13 may be adjusted considering the gap-fill characteristics of the interlayer dielectric layer in the subsequent process of forming the interlayer dielectric layer and the thickness of the nitride layer 13 to be lost to the interlayer dielectric layer. For example, the nitride layer 13 may be formed in a thickness range from approximately 60 Å to approximately 130 Å.

Before forming the nitride layer 13, spacer layers may be formed on both sidewalls of the patterns 12 in order to protect both sidewalls of the patterns 12 during the subsequent processes.

Figure 3B:
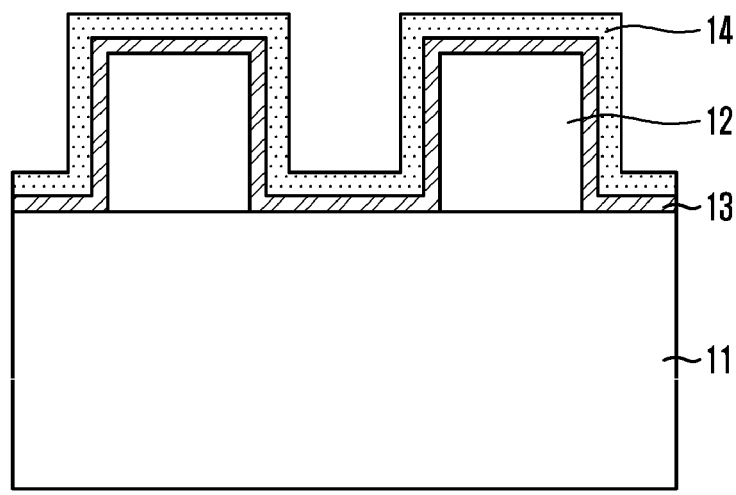

Referring to FIG. 3B, a first insulation layer 14 is formed over the nitride layer 13 to a uniform thickness by using a silicon source and a phosphorus source. The first insulation layer 14 contains a phosphorus content by which loss of the nitride layer 13 can be prevented during the subsequent processes. In this case, the first insulation layer 14 may be formed to a small thickness, for example, 150 Å to 250 Å, considering the gap-fill characteristics of a second insulation layer which will be formed through a subsequent process. If the thickness of the first insulation layer 14 is less than 150 Å, the nitride layer 13 may be lost because impurities contained in the interlayer dielectric layer pass through the first insulation layer 14. If the thickness of the first insulation layer 14 is greater than 250 Å, the gap-fill characteristics of the second insulation layer may be degraded in a subsequent process of forming the second insulation layer.

The first insulation layer 14 formed using the silicon source and the phosphorus source may include a phosphorus-containing silicon oxide layer, for example, a phosphor silicate glass (BPS) layer or a boron phosphor silicate glass (BPSG) layer. In this case, the first insulation layer 14 may be formed using a BPSG layer, considering the layer quality and reflow characteristics of the first insulation layer 14. Meanwhile, the insulation layer containing impurities, for example, a BSG layer, a PSG layer or a BPSG layer, have superior layer quality and reflow characteristics to an insulation layer containing no impurities, for example, an undoped silicate glass (USG) layer. Among the insulation layers containing impurities, a phosphorus-containing insulation layer (for example, a PSG layer or a BPSG layer) have relatively excellent layer quality, and a boron-containing insulation layer (for example, a BSG layer or a BPSG layer) has relatively excellent reflow characteristics. Therefore, the BPSG layer is considered as an insulation layer which can meet both the layer quality and reflow characteristics requirements of a highly-integrated semiconductor device. A flowable oxide layer may be used as the first insulation layer 14. Examples of the flowable oxide layer may include a spin on dielectric (SOD) layer, a spin on glass (SOG) layer, an advanced planarization layer (APL), and a hydrogen silsesquioxane (HSQ) layer. However, the layer quality of flowable oxide layer is not dense due to porous characteristics, and the flowable oxide layer may be easily lost. Thus, the flowable oxide layer is therefore not an optimal replacement for the BPSG layer.

A method for fabricating the first insulation layer 14 using the BPSG layer will be described below in detail.

A substrate 11 where a nitride layer 13 has been formed, is loaded into a chamber. A source of silicon, a source of oxygen, a source of phosphorus, and a source of boron are injected into the chamber and reacted with one another to form a first insulating layer 14. A tetra ethyl ortho silicate (TEOS) gas, an oxygen ($O_2$) gas, a tri ethyl phosphate (TEP) gas, and a tri ethyl borate (TEB) gas may be used as the source of silicon, the source of oxygen, the source of phosphorus, and the source of boron, respectively. In addition, a variety of known materials may be used as the source material.

The flow rates of the phosphorus source and the boron source between the deposition processes are adjusted such that contents of phosphorus and boron in the first insulation layer 14 have a range from approximately 2 wt % to approximately 3.5 wt % in order to prevent the loss of the nitride layer 13 and ensure the layer quality and reflow characteristics. In this case, the contents (or concentration) of phosphorus and boron contained in the first insulation layer 14 may be equal to each other, or the content of phosphorus may be larger than the content of boron. This is done for reduce the thermal treatment temperature in the reflow thermal treatment.

When the content of phosphorus contained in the first insulation layer 14 is less than 2 wt %, the layer quality of the first insulation layer 14 is degraded and thus it is difficult to effectively prevent the loss of the nitride layer 13 during the subsequent processes. Also, when the content of phosphorus contained in the first insulation layer 14 is greater than 3.5 wt %, the nitride layer 13 may be lost due to the phosphorus contained therein.

Furthermore, in order to prevent the nitride layer 13 from being lost by the impurity source remaining between reactions and after the reactions in the process of forming the first insulation layer 14, a source of silicon is supplied into the chamber at a high flow rate to scavenge the source of phosphorus remaining in the chamber. For example, the source of silicon may be supplied at a flow rate ranging from approximately 900 mgm (mg/minute) to approximately 2,500 mgm (mg/minute). In this way, if the contents of phosphorus and boron in the layer are reduced and the silicon source is supplied at a high flow rate in the process of forming the first insulation layer 14, it is possible to prevent the generation of impurities, especially phosphorus, which do not participate in the reaction between the deposition processes. Furthermore, it is possible to prevent phosphorus from remaining in an unstable state where phosphorus is not bonded to silicon in the first insulation layer 14 when the deposition process is completed. Therefore, it is possible to prevent the generation of phosphoric acid through the reaction of phosphorus and water in the deposition process and subsequent processes (especially, the thermal treatment). Thus, it is possible to prevent the nitride layer 13 from being lost due to the presence of the first insulation layer 14.

Even though the content of phosphorus in the first insulation layer 14 (for example, in a range of approximately 2 wt % to approximately 3.5 wt %) is reduced, the first insulation layer 14 has a small thickness (for example, approximately 150 Å to approximately 250 Å). Thus, it is possible to prevent the degradation of the reflow characteristics of the interlayer dielectric layer including the first and second insulation layers during the subsequent reflow thermal process.

Figure 3C:
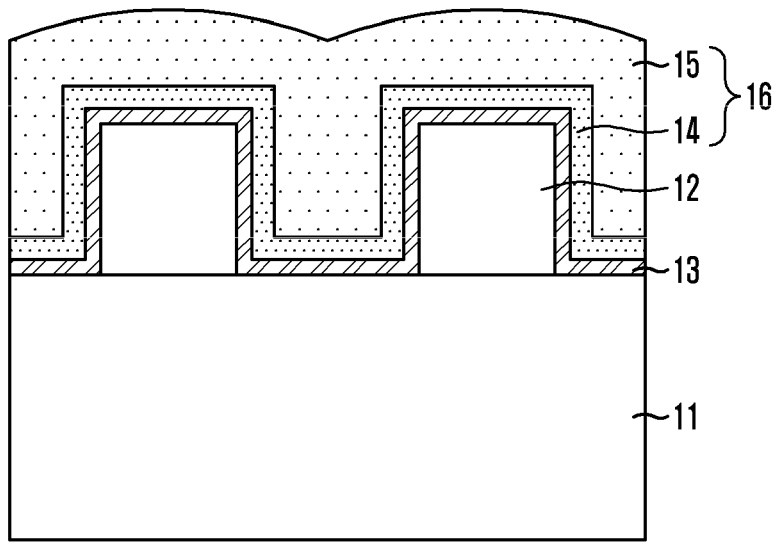

Referring to FIG. 3C, a second insulation layer 15 is formed over the first insulation layer 14 to fill the gap between patterns 12. The second insulation layer 15 has a larger content of phosphorus than that of the first insulation layer 14. The second insulation layer 15 serves to enhance the reflow characteristics of the interlayer dielectric layer 16 comprised of the first and second insulation layers 14 and 15. Thus, the second insulation layer 15 may be formed to have the content of phosphorus at which the reflow characteristics required by the semiconductor device can be ensured.

The second insulation layer 15 may be formed of the same material as the first insulation layer 14. Therefore, the second insulation layer 15 may be formed of BPSG by using the sources of silicon and phosphorus. In this case, the second insulation layer 15 is formed using a lower flow rate of the silicon source and a higher flow rate of the phosphorus source than used to form the first insulation layer 14. That is, the first insulation layer 14 is formed at a higher flow rate of the silicon source and a lower flow rate of the phosphorus source than the second insulation layer 15.

The process of forming the second insulation layer 15 of BPSG will be described below in more detail.

The second insulation layer 15 is formed in-situ within the same chamber, where the first insulation layer 14 is formed, by injecting and reacting a silicon source, an oxygen source, a phosphorus source, and a boron source. In this case, the contents of phosphorus and boron in the second insulation layer 15 and the gap-fill characteristics of the second insulation layer 15 are adjusted by controlling the flow rates of the silicon source, the phosphorus source, and the boron source. A TEOS gas, an oxygen gas, a TEP gas, and a TEB gas may be used as the silicon source, the oxygen source, the phosphorus source, and the boron source, respectively.

The flow rates of the phosphorus source and the boron source between the deposition processes are adjusted such that contents of phosphorus and boron in the second insulation layer 15 have a range from approximately 3.5 wt % to approximately 6 wt % in order to ensure the layer quality and reflow characteristics of the interlayer dielectric layer 16 including the first and second insulation layers 14 and 15. In this case, the contents of phosphorus and boron contained in the second insulation layer 15 may be equal to each other, or the content of phosphorus may be larger than the content of boron. This is done for reduce the thermal treatment temperature in the reflow thermal treatment.

When the content of phosphorus contained in the second insulation layer 15 is less than 3.5 wt %, the reflow characteristics of the second insulation layer 15 may be degraded or the reflow thermal treatment temperature may be increased (for example, 800° C. or more), thus causing a thermal diffusion of impurities (for example, phosphorus or boron). Also, when the content of phosphorus contained in the second insulation layer 15 is greater than 6 wt %, the impurities, especially phosphorus, penetrate into the first insulation layer 14, thus causing the loss of the nitride layer 13.

Furthermore, in order to enhance the gap-fill characteristics of the second insulation layer 15, the deposition rate is reduced by supplying the silicon source into the chamber at a low flow rate. For example, the silicon source may be supplied at a flow rate ranging from approximately 500 mgm to approximately 900 mgm. At this point, if the contents of phosphorus and boron in the layer are high and the silicon source is supplied at a low flow rate, impurities (that is, non-reacted phosphorus) which do not participate in the reaction are generated. Furthermore, phosphorus may remain in an unstable state where it is not bonded to silicon in the second insulation layer 15. However, the first insulation layer 14 serves as a barrier layer with respect to the nitride layer 13. Thus, it is possible to prevent the nitride layer 13 from being lost by non-reacted phosphorus generated in the process of depositing the second insulation layer 15 and phosphorus having an unstable bonding state in the second insulation layer 15.

Meanwhile, due to the stepped portion of the lower structure, the surface of the second insulation layer 15 may be stepped in the process of forming the second insulation layer 15. Also, due to the high aspect ratio of the patterns 12, defects such as voids in the layer may be generated. Such defects and stepped surface must be removed because they have a detrimental influence during the subsequent processes.

Figure 3D:
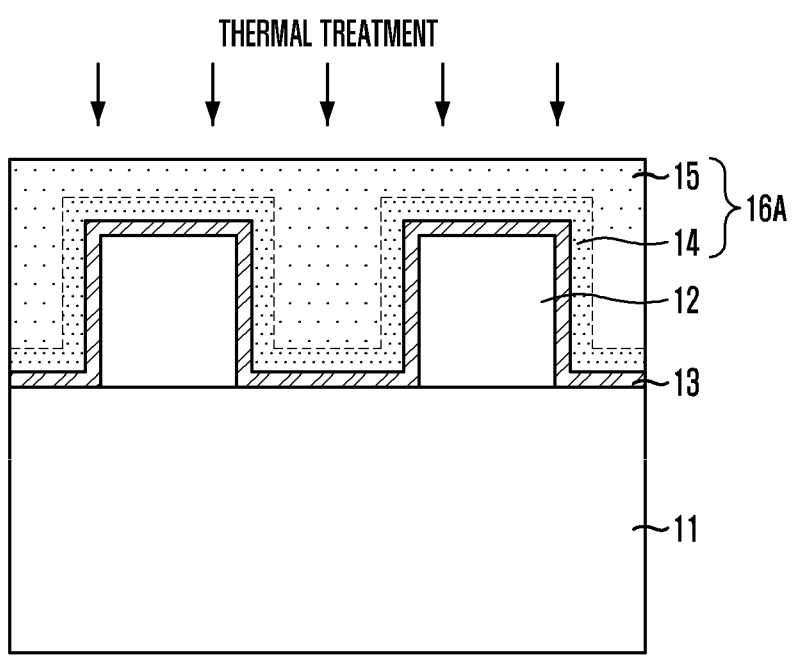

As illustrated in FIG. 3D, a thermal treatment for reflowing the interlayer dielectric layer 16 is performed in order to remove the voids in the layer and the stepped surface. The thermal treatment may be performed by a furnace heat treatment or a rapid thermal process in a temperature range from approximately 750° C. to approximately 800° C. A reference numeral 16A refers to the reflowed interlayer dielectric layer.

In the reflow thermal treatment, phosphorus and boron into in the second insulation layer 15 may penetrate into the nitride layer 13 due to a thermal diffusion. However, the first insulation layer 14 having the relatively smaller contents of phosphorus and boron than the second insulation layer 15 serves as a barrier layer to thereby prevent phosphorus and boron from penetrating into the nitride layer 13 or patterns 12. Therefore, due to the first insulation layer 14, it is possible to prevent the nitride layer 13 from being lost in the reflow thermal treatment of the interlayer dielectric layer 16A. Also, due to the second insulation layer 15, the reflow characteristics can be ensured. Furthermore, due to the first insulation layer 14, it is possible to prevent the degradation of the characteristics of the semiconductor device, which is caused when impurities in the interlayer dielectric layer 16A, especially boron, penetrate into the substrate 11 or patterns 12.

When forming the phosphorus-containing insulation layer on the nitride layer 13, the first insulation layer 14 which contacts the nitride layer 13 is formed by using a higher flow rate of the silicon source and a lower flow rate of the phosphorus source than the second insulation layer 15 formed on the first insulation layer 14. Therefore, it is possible to prevent the loss of the nitride layer 13 due to the phosphorus-containing insulation layer during the processes, and it is also possible to ensure the reflow characteristics and gap-fill characteristics of the interlayer dielectric layer 16A including the first and second insulation layers 14 and 15.

Another Embodiment

FIGS. 4A to 4E are cross-sectional views illustrating a method for fabricating a semiconductor device in accordance with another embodiment.

Figure 4A:
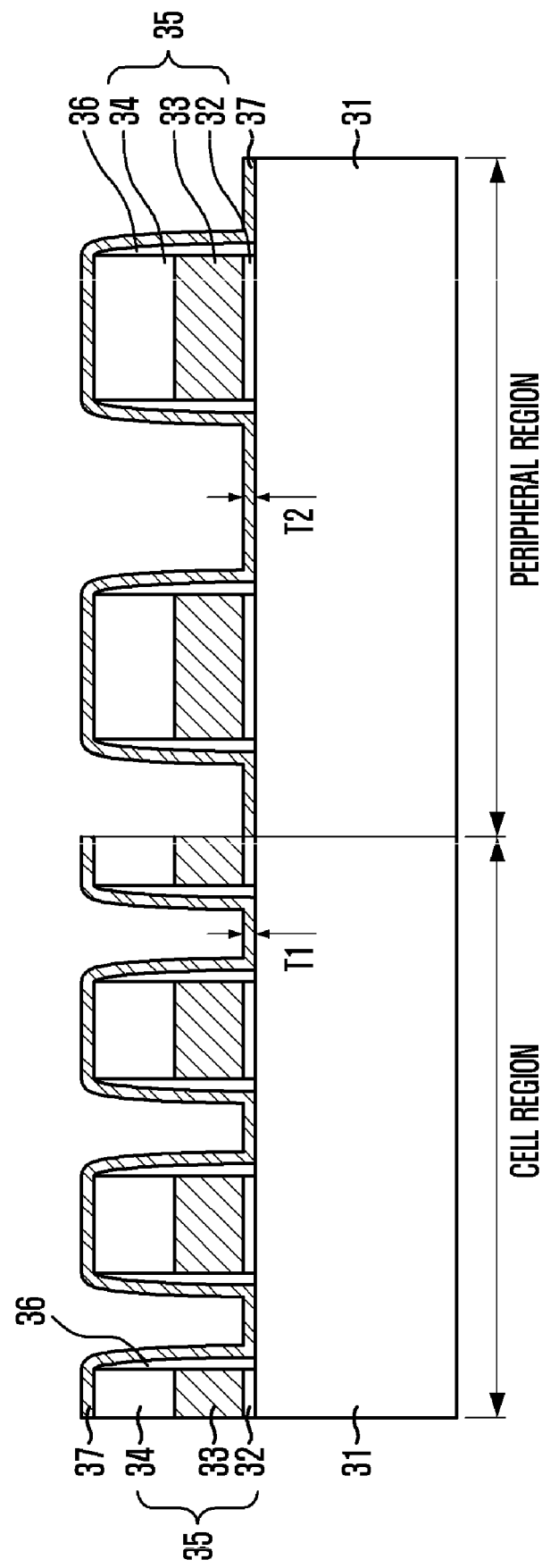
FIGS. 4A to 4E are cross-sectional views illustrating a method of fabricating a semiconductor device in accordance with another embodiment.

Referring to FIG. 4A, a plurality of patterns 35 are formed over a substrate 31 defining a cell region and a peripheral region. A gap between the gates 35 formed in the cell region is greater than a gap between the gates 35 formed in the peripheral region. That is, the gates 35 in the cell region are arranged densely, and the gates 35 in the peripheral region are arranged sparsely.

The gates 35 may have a stacked structure of a gate dielectric layer 32, a gate electrode 33, and a gate hard mask layer 34.

The gate dielectric layer 32 may be formed of oxide, for example, silicon oxide ($SiO_2$). The silicon oxide layer for the gate dielectric layer 32 may be formed by a thermal oxidation process.

The gate electrode 33 may include a silicon layer, a metallic layer, or a stacked layer thereof. The silicon layer may be formed of polysilicon (poly Si) or silicon germanium (SiGe), and the metallic layer may be formed of tungsten (W), titanium (Ti), titanium nitride (TiN), or tungsten silicide (WSi).

The gate hard mask layer 34 may be formed of one selected from an oxide layer, a nitride layer, an oxynitride layer, and a stacked layer thereof.

Before forming the gates 35, the substrate 31 may be selectively etched to form recess patterns (not shown). The recess patterns may be formed in one type selected from the group consisting of a rectanglular type, a polygonal type, a bulb type, a fin type, and a saddle fin type.

An insulation layer (not shown) for spacers is formed to a certain thickness along the surface of a resulting structure including the gates 35, and a blanket etching process (for example, an etch-back process) is performed to form gate spacer layers 36 on both sidewalls of the gates 35. The gate spacer layers 36 protects the gates 35 during the processes and electrically separates the gates 35 from landing plugs which will be formed in a subsequent process.

The gate spacer layer 36 may include a stacked layer of an oxide layer and a nitride layer (an oxide/nitride layer or an oxide/nitride/oxide layer), or a single nitride layer.

A nitride layer 37 is formed over a resulting structure including the gates 35. The nitride layer 37 prevents impurities contained in an interlayer dielectric layer from penetrating into the substrate 31 or gates 35 in a subsequent process of forming the interlayer dielectric layer. The nitride layer 37 may be formed of silicon nitride ($Si_3N_4$).

The deposited thickness of the nitride layer 37 may be adjusted considering the gap-fill characteristics of the interlayer dielectric layer in the subsequent process of forming the interlayer dielectric layer and the thickness of the nitride layer 37 to be lost by the interlayer dielectric layer. For example, the nitride layer 37 may be formed in a thickness range from approximately 60 Å to approximately 130 Å.

Figure 4B:
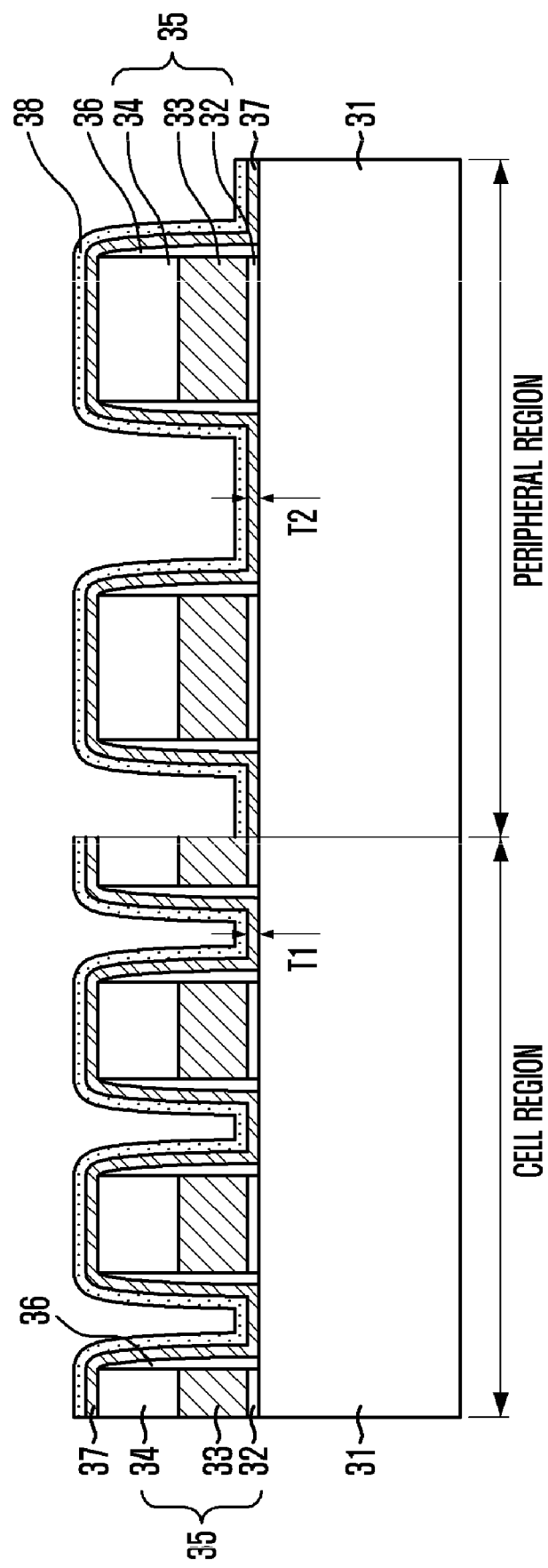

Referring to FIG. 4B, a first insulation layer 38 is formed over the nitride layer 37 to and uniform thickness by using a silicon source and a phosphorus source. The first insulation layer 38 contains a phosphorus content via which loss of the nitride layer 37 can be prevented during the processes involved in this embodiment. In this case, the first insulation layer 38 may be formed to a small thickness, for example, 150 Å to 250 Å, considering the gap-fill characteristics of a second insulation layer which will be formed through a subsequent process. If the thickness of the first insulation layer 38 is less than 150 Å, the nitride layer 37 may be lost because impurities contained in the interlayer dielectric layer pass through or penetrate into the first insulation layer 38. If the thickness of the first insulation layer 38 is greater than 250 Å, the gap-fill characteristics of the second insulation layer may be degraded in a subsequent process of forming the second insulation layer.

The first insulation layer 38 formed using the silicon source and the phosphorus source may include a phosphorus-containing silicon oxide layer, for example, a phosphor silicate glass (BPS) layer or a boron phosphor silicate glass (BPSG) layer. In this case, the first insulation layer 38 may be formed using a BPSG layer, considering the layer quality and reflow characteristics of the first insulation layer 38. Meanwhile, the insulation layer containing impurities, for example, a BSG layer, a PSG layer or a BPSG layer, have superior layer quality and reflow characteristics to the insulation layer containing no impurities, for example, an undoped silicate glass (USG) layer. Among the insulation layer containing impurities, a phosphorus-containing insulation layer (for example, a PSG layer or a BPSG layer) has a relatively excellent layer quality, and a boron-containing insulation layer (for example, a BSG layer or a BPSG layer) has relatively excellent reflow characteristics. Therefore, the BPSG layer is considered as an insulation layer which can meet both the layer quality and reflow characteristics requirements of a highly-integrated semiconductor device. Furthermore, a flowable oxide layer may be used as the first insulation layer 38. Examples of the flowable oxide layer may include a spin on dielectric (SOD) layer, a spin on glass (SOG) layer, an advanced planarization layer (APL), and a hydrogen silsesquioxane (HSQ) layer. However, in some circumstances the layer quality of flowable oxide layer is not dense due to porous characteristics, and the flowable oxide layer may be easily lost. Thus, in these instances the flowable oxide layer is less preferred than the BPSG layer.

A method for fabricating the first insulation layer 38 using a BPSG layer will be described below in detail.

A substrate 31 on which the nitride layer 37 has been formed, is loaded into a processing chamber. A silicon source, an oxygen source, a phosphorus source, and a boron source are injected into the chamber and react with one another to form a first insulating layer 38. A tetra ethyl ortho silicate (TEOS) gas, an oxygen ($O_2$) gas, a tri ethyl phosphate (TEP) gas, and a tri ethyl borate (TEB) gas may be used as the silicon source, the oxygen source, the phosphorus source, and the boron source, respectively. Alternatively or in addition, a variety of other known materials may be used as the above source materials.

The flow rates of the phosphorus source and the boron source between the deposition processes are adjusted such that contents of phosphorus and boron in the first insulation layer 38 have a range from approximately 2 wt % to approximately 3.5 wt % in order to prevent the loss of the nitride layer 37 and to ensure the layer quality and required reflow characteristics. In this case, the contents (or concentration) of phosphorus and boron contained in the first insulation layer 38 may be equal to each other, or the content of phosphorus may be larger than the content of boron. This is done to reduce the thermal treatment temperature during the reflow thermal treatment.

When the content of phosphorus contained in the first insulation layer 38 is less than 2 wt %, the layer quality of the first insulation layer 38 tends to be degraded and thus it is difficult to effectively prevent the loss of the nitride layer 37 during the subsequent processes. Also, when the content of phosphorus contained in the first insulation layer 38 is greater than 3.5 wt %, the nitride layer 37 may be lost due to the phosphorus contained therein.

Furthermore, in order to prevent the nitride layer 37 from being lost by the impurity source remaining between reactions and after the reactions in the process of forming the first insulation layer 38, a silicon source is supplied into the chamber at a high flow rate to scavenge the phosphorus source from the chamber. For example, the silicon source may be supplied at a flow rate ranging from approximately 900 mgm (mg/minute) to approximately 2,500 mgm (mg/minute). In this way, if the amounts of phosphorus and boron in the layer are reduced and the silicon source is supplied at a high flow rate in the process of forming the first insulation layer 38, it is possible to prevent the generation of impurities, especially phosphorus, which do not participate in the reaction between the deposition processes. Furthermore, it is possible to prevent phosphorus from remaining in an unstable state where phosphorus is not bonded to silicon in the first insulation layer 38 when the deposition process is completed. Therefore, it is possible to prevent the generation of phosphoric acid through the reaction of phosphorus and water in the deposition process and subsequent processes (especially, the thermal treatment). Thus, it is possible to prevent the nitride layer 37 from being lost due to the first insulation layer 38.

Even though the content of phosphorus in the first insulation layer 38 (for example, in a range of approximately 2 wt % to approximately 3.5 wt %) is reduced, the first insulation layer 38 has a small thickness (for example, approximately 150 Å to approximately 250 Å). Thus, it is possible to prevent the degradation of the reflow characteristics of the interlayer dielectric layer including the first and second insulation layers during the subsequent reflow thermal process. Furthermore, since the first insulation layer 38 is formed to have a small thickness at which the gap between the gates 35 are not filled, an amount of the first insulation layer 38 formed between the gates 35 of the cell region is equal to that of the first insulation layer 38 formed between the gates 35 of the peripheral region. Therefore, even though some of the nitride layer 37 is lost in the process of forming the first insulation layer 38, the loss amount of the nitride 37 in the cell region can be controlled to be equal to that of the nitride layer 37 in the peripheral region.

Therefore, when the process of forming the first insulation layer 38 is completed, the thickness (T1) of the nitride layer 37 in the cell region may be effectively equal to the thickness (T2) of the nitride layer 37 in the peripheral region (T1=T2).

Figure 4C:
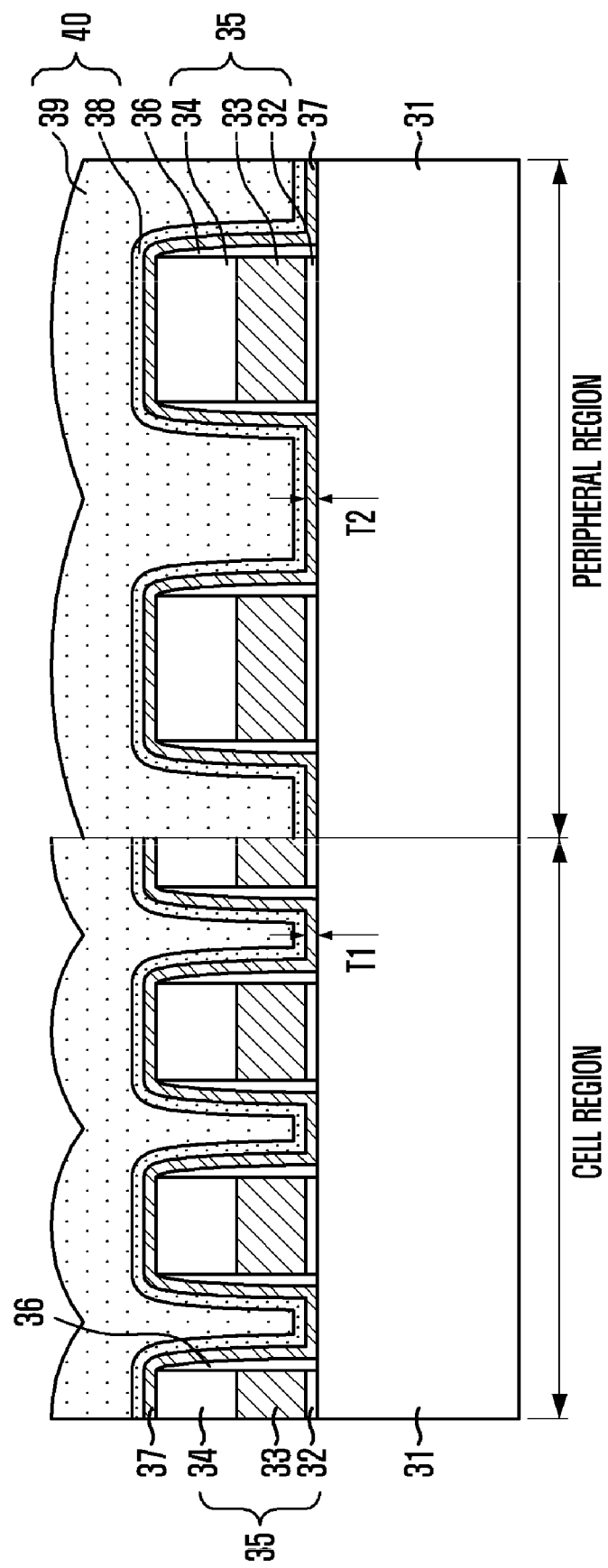

Referring to FIG. 4C, a second insulation layer 39 is formed over the first insulation layer 38 to fill the gap between the gates 35. The second insulation layer 39 has a larger content of phosphorus than the first insulation layer 38. The second insulation layer 39 serves to enhance the reflow characteristics of the interlayer dielectric layer 40 including the first and second insulation layers 38 and 39. Thus, the second insulation layer 39 may be formed to have a content of phosphorus at which the reflow characteristics required can be ensured.

The second insulation layer 39 may be formed of the same material as the first insulation layer 38. Therefore, the second insulation layer 39 may be formed of BPSG by using the silicon source and the phosphorus source. In this case, the second insulation layer 39 is formed at a lower flow rate of the silicon source and a higher flow rate of the phosphorus source than in the case of the first insulation layer 38. That is, the first insulation layer 38 is formed at a higher flow rate of the silicon source and a lower flow rate of the phosphorus source than with the second insulation layer 39.

The process of forming the second insulation layer 39 of BPSG will be described below in more detail.

The second insulation layer 39 is formed in-situ within the same chamber, where the first insulation layer 38 is formed, by injecting and reacting a silicon source, an oxygen source, a phosphorus source, and a boron source. In this case, the contents of phosphorus and boron in the second insulation layer 39 and the gap-fill characteristics of the second insulation layer 39 are adjusted by controlling the flow rates of the silicon source, the phosphorus source, and the boron source. A TEOS gas, an oxygen gas, a TEP gas, and a TEB gas may be used as the silicon source, the oxygen source, the phosphorus source, and the boron source, respectively.

The flow rates of the phosphorus source and the boron source between the deposition processes are adjusted such that contents of phosphorus and boron in the second insulation layer 39 have a range from approximately 3.5 wt % to approximately 6 wt % in order to ensure the layer quality and reflow characteristics of the interlayer dielectric layer 40 including the first and second insulation layers 38 and 39. In this case, the contents of phosphorus and boron contained in the second insulation layer 39 may be equal to each other, or the content of phosphorus may be larger than the content of boron. This is done for reduce the thermal treatment temperature in the reflow thermal treatment.

When the content of phosphorus contained in the second insulation layer 39 is less than 3.5 wt %, the reflow characteristics of the second insulation layer 39 may be degraded or the reflow thermal treatment temperature may be increased (for example, 800° C. or more), thus causing a thermal diffusion of impurities (for example, phosphorus or boron). Also, when the content of phosphorus contained in the second insulation layer 39 is greater than 6 wt %, the impurities, especially phosphorus, penetrate into the first insulation layer 38, thus causing the loss of the nitride layer 37.

Furthermore, in order to enhance the gap-fill characteristics of the second insulation layer 39, the deposition rate is reduced by supplying the silicon source into the chamber at a low flow rate. For example, the silicon source may be supplied at a flow rate ranging from approximately 500 mgm to approximately 900 mgm. At this point, if the contents of phosphorus and boron in the layer are high and the silicon source is supplied at a low flow rate, impurities (that is, non-reacted phosphorus) which do not participate in the reaction are generated. Furthermore, phosphorus may remain in an unstable state where it is not bonded to silicon in the second insulation layer 39. However, the first insulation layer 38 serves as a barrier layer with respect to the nitride layer 37. Thus, it is possible to prevent the nitride layer 37 from being lost due to the presence of non-reacted phosphorus generated in the process of depositing the second insulation layer 39 and phosphorus having an unstable bonding state in the second insulation layer 39.

Therefore, when the process of forming the second insulation layer 39 is completed, the thickness (T1) of the nitride layer 37 in the cell region may be effectively equal to the thickness (T2) of the nitride layer 37 in the peripheral region (T1=T2).

Meanwhile, due to the stepped portion of the lower structure, the surface of the second insulation layer 39 may be stepped in the process of forming the second insulation layer 39. Also, due to the high aspect ratio of the patterns 35, defects such as voids in the layer may be generated. Such defects and stepped surface must be removed because they have a detrimental influence during the subsequent processes.

Figure 4D:
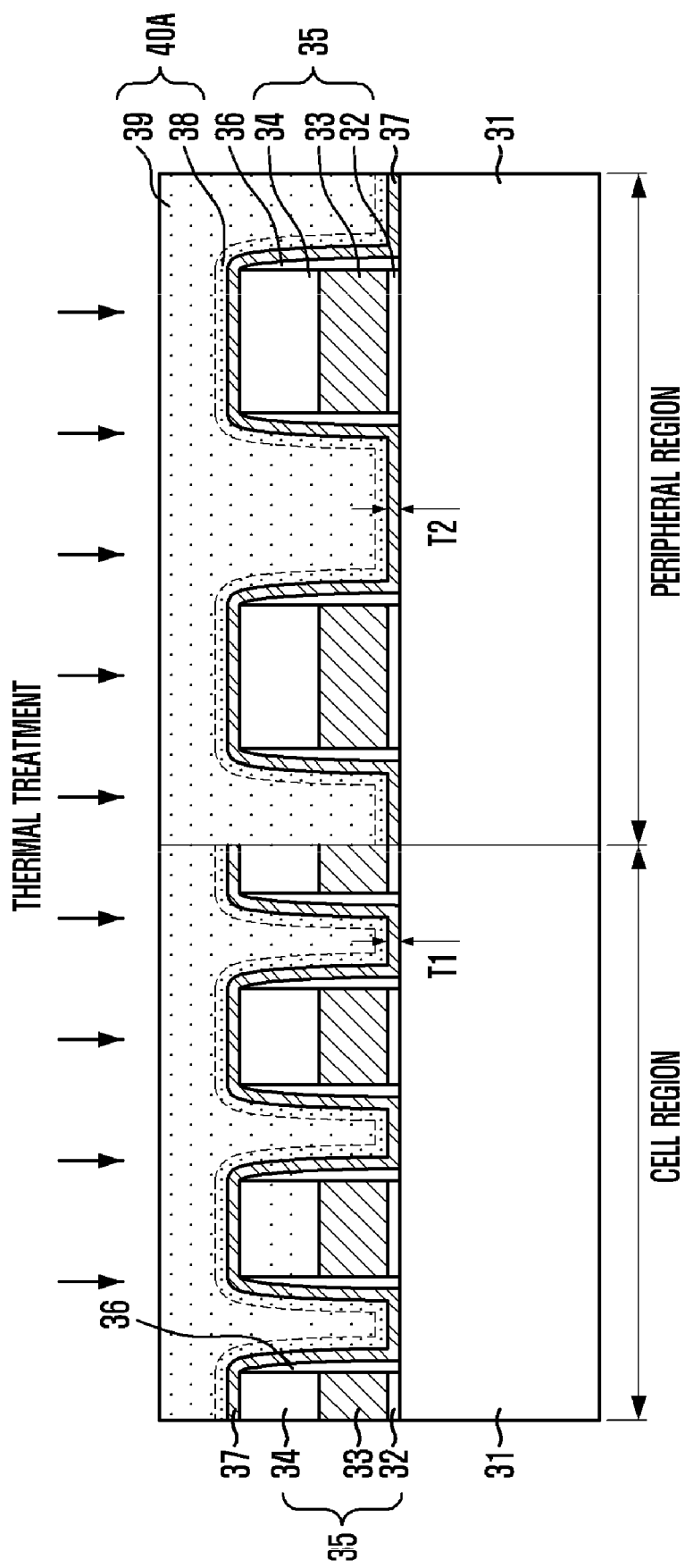

As illustrated in FIG. 4D, a thermal treatment for reflowing the interlayer dielectric layer 40 is performed in order to remove the voids in the layer and the stepped surface. The thermal treatment may be performed by a furnace heat treatment or a rapid thermal process in a temperature range from approximately 750° C. to approximately 800° C. A reference numeral 40A refers to the reflowed interlayer dielectric layer.

In the reflow thermal treatment, phosphorus and boron in the second insulation layer 39 may penetrate the nitride layer 37 due to thermal diffusion. However, the first insulation layer 38 having the relatively smaller contents of phosphorus and boron than the second insulation layer 39 serves as a barrier layer to thereby prevent phosphorus and boron from penetrating into the nitride layer 37 or gates 35. Therefore, due to the first insulation layer 38, it is possible to prevent the nitride layer 37 from being lost in the reflow thermal treatment of the interlayer dielectric layer 40A. Also, due to the second insulation layer 39, the reflow characteristics can be ensured. Furthermore, due to the first insulation layer 38, it is possible to prevent the degradation of the characteristics of the semiconductor device, which is caused when impurities in the interlayer dielectric layer 40A, especially boron, penetrate into the substrate 31 or gates 35.

Therefore, when the reflow thermal treatment is completed, the thickness (T1) of the nitride layer 37 in the cell region may be equal to the thickness (T2) of the nitride layer 37 in the peripheral region (T1=T2).

Through the above-described processes, it is possible to prevent impurities in the interlayer dielectric layer 40A from penetrating into the substrate 31 or gates 35 when the nitride layer 37 of the peripheral region is excessively lost due to the interlayer dielectric layer 40A. Also, it is possible to prevent the contact-not-open phenomenon from being generated in the process of forming a contact hole for a landing plug when the nitride layer 37 remains in the cell region much more than necessary.

Although not shown, a planarization process may be performed after the thermal treatment under conditions of exposing the gate hard mask layer 34. This is done to increase an etching margin in the process of forming the contact hole for the landing plug. The planarization process may be performed using a chemical mechanical polishing (CMP).

Figure 4E:
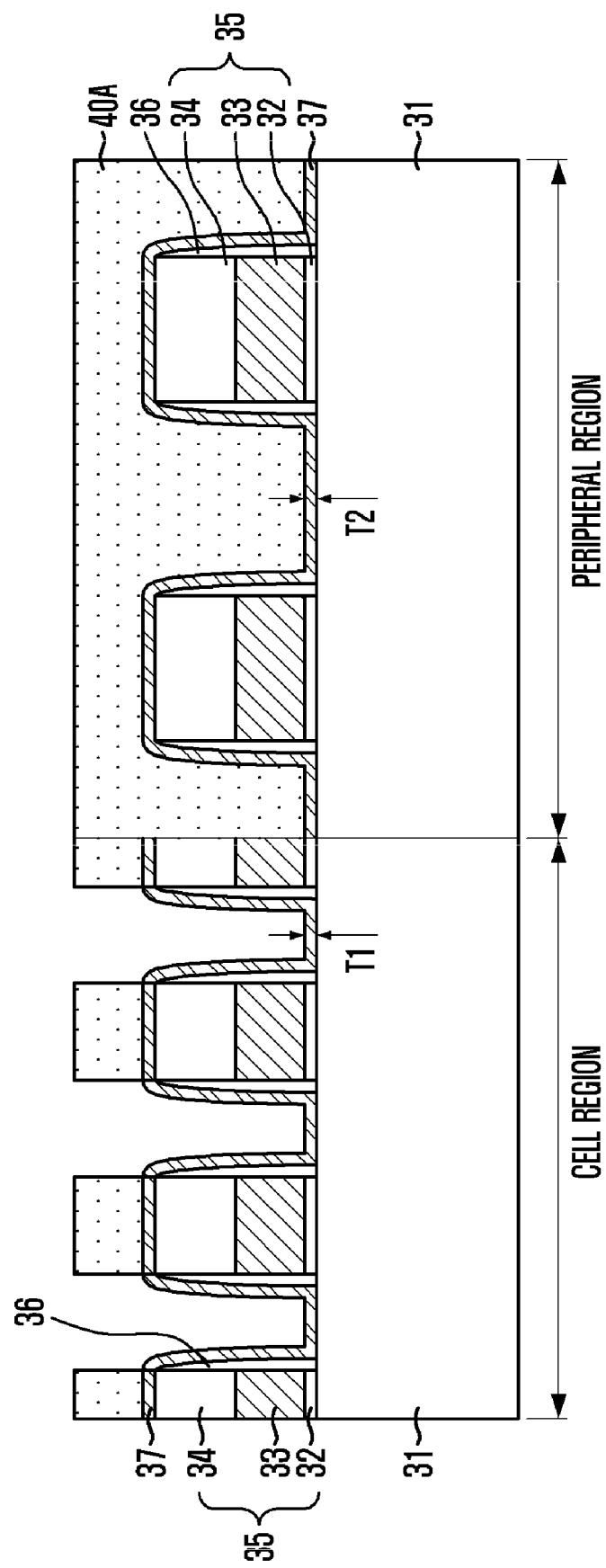

Referring to FIG. 4E, the interlayer dielectric layer 40A of the cell region is selectively etched to form a contact hole 41 exposing the substrate 31 of the cell region. The contact hole 41 is formed for the landing plug connected to a bit line and a storage node contact plug.

When forming the phosphorus-containing insulation layer on the nitride layer 37, the first insulation layer 38 contacting the nitride layer 37 is formed by using a higher flow rate of the silicon source and a lower flow rate of the phosphorus source than the second insulation layer 39 formed on the first insulation layer 38. Therefore, it is possible to prevent the loss of the nitride layer 37 due to the phosphorus-containing insulation layer during the processes, and it is also possible to ensure the reflow characteristics and gap-fill characteristics of the interlayer dielectric layer 40A including the first and second insulation layers 38 and 39.

Furthermore, when forming the phosphorus-containing insulation layer on the nitride layer 37, the loss of the nitride layer 37 can be prevented by forming the phosphorus-containing insulation layer in a stacked structure where the first and second insulation layers 38 and 39 having different contents of phosphorus, are stacked. Thus, when the reflow thermal treatment of the phosphorus-containing insulation layer is completed, the thickness of the nitride layer 37 remaining in the cell region may be equal to the thickness of the nitride layer 37 remaining in the peripheral region. That is, even though an amount of the interlayer dielectric layer 40A filled between the gates 35 is different due to the different gap between the gates 35, it is possible to reduce the difference in the loss amount of the nitride layer 37, which is caused by the different gaps. Therefore, it is possible to prevent the contact-not-open phenomenon from being generated in the process of forming the contact hole 41 in the cell region. Also, it is possible to prevent impurities (especially, boron) contained in the interlayer dielectric layer 40A from penetrating into the substrate 31 or gates 35 in the peripheral region. Consequently, the deposition thickness of the initial nitride layer 37 can be reduced, and the integration density of the semiconductor device can be increased.

EXPERIMENTAL RESULTS

Figure 5:
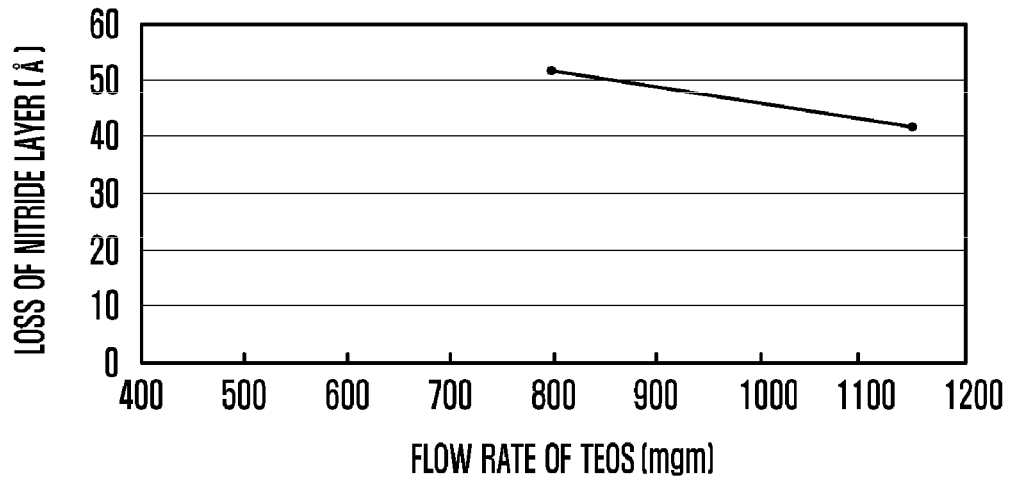
FIG. 5 is a graph illustrating loss amount of a nitride layer with respect to a flow rate of a silicon source in a process of depositing a BPSG layer.

FIG. 5 is a graph illustrating loss amount of the nitride layer with respect to the flow rate of the silicon source in the process of depositing the BPSG layer. In this experiment, TEOS was used as the silicon source.

As can be seen from FIG. 5, when the flow rates of the phosphorus source and the boron source are fixed, the loss amount of the nitride layer is reduced as the flow rate of the silicon source increases. This is because the increase of the flow rate of the silicon source reduces an amount of non-reacted phosphorus source and boron source remaining in the chamber without participating in the reaction.

Figure 6:
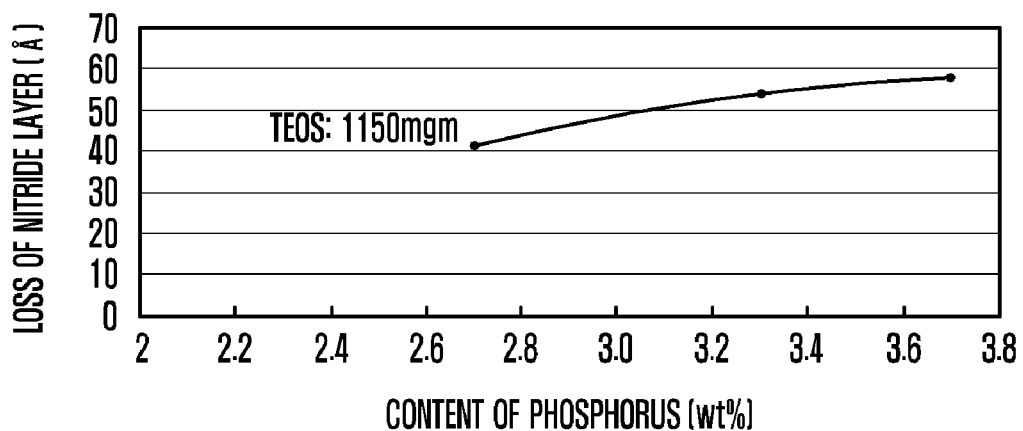
FIG. 6 is a graph illustrating the loss amount of a nitride layer with respect to the content of phosphorus in the layer during a process of depositing a BPSG layer.

FIG. 6 is a graph illustrating loss amount of the nitride layer with respect to the content of phosphorus in the layer in the process of depositing the BPSG layer. As the silicon source, TEOS was used at a flow rate of 1150 mgm.

As can be seen from FIG. 6, when the flow rate of the silicon source is fixed, the loss amount of the nitride layer increases as the content of phosphorus in the layer increases. This is because the increase of the content of phosphorus, that is, the increase of the flow rate of the phosphorus source in the deposition process increases an amount of the phosphorus source remaining in the chamber without participating in the reaction, and the remaining phosphorus source reacts with water to generate the phosphoric acid.

Figure 7:
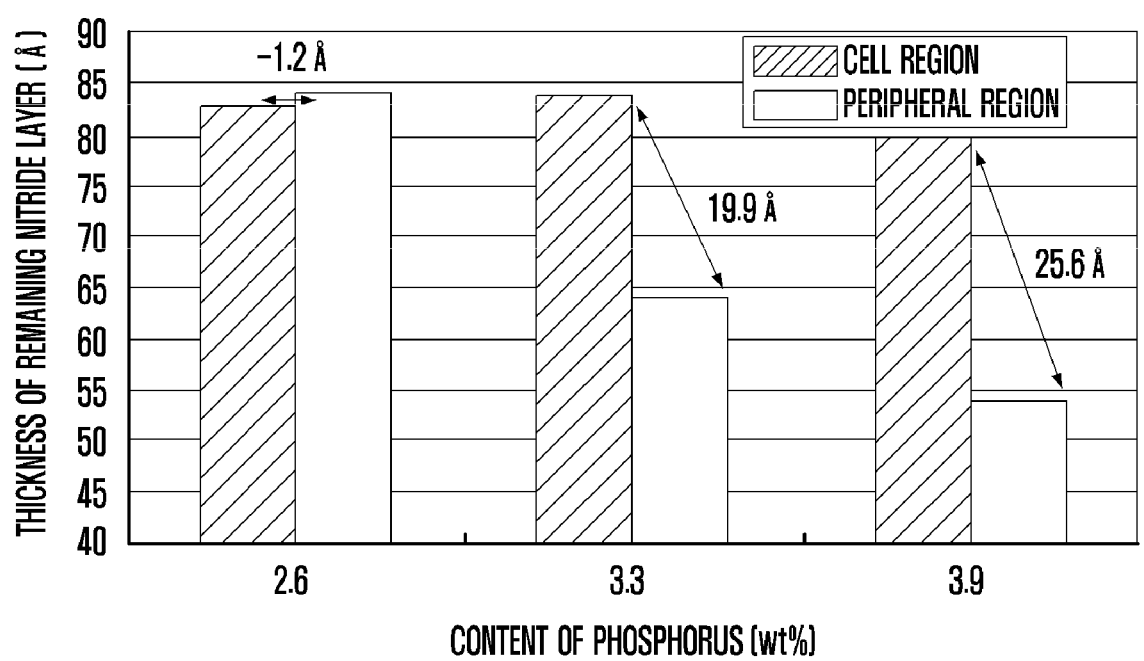
FIG. 7 is a graph illustrating thickness difference of a remaining nitride layer according to gap difference of patterns after a reflow thermal treatment of a BPSG layer.

FIG. 7 is a graph illustrating the thickness difference of the remaining nitride layer according to the gap difference of the patterns after the reflow thermal treatment of the BPSG layer. The gap between the patterns in the cell region is greater than the gap between the patterns in the peripheral region, and the thickness of the initial nitride layer before the deposition of the BPSG layer is 120 Å.

As can be seen from FIG. 7, in the process of depositing the BPSG layer after forming the nitride layer having the same thickness in the cell region and the peripheral region having different gap between the patterns, as the content of phosphorus in the layer increases, the loss amount of the nitride layer formed in the peripheral region where the gap between the patterns is large is greater than the loss amount of the nitride layer formed in the cell region where the gap between the patterns is relatively small. This is because as the gap between the patterns is larger, an amount of the BPSG layer filled between the patterns is large.

In accordance with the embodiments, when forming the phosphorus-containing insulation layer on the nitride layer, the first insulation layer contacting the nitride layer is formed by using a higher flow rate of the silicon source and a lower flow rate of the phosphorus source than the second insulation layer formed on the first insulation layer. Therefore, it is possible to prevent the loss of the nitride layer due to the phosphorus-containing insulation layer during the processes, and it is also possible to ensure the reflow characteristics and gap-fill characteristics of the interlayer dielectric layer including the first and second insulation layers.

Furthermore, when forming the phosphorus-containing insulation layer on the nitride layer, the loss of the nitride layer can be prevented by forming the phosphorus-containing insulation layer in a stacked structure where the first and second insulation layers having different contents of phosphorus are stacked. Thus, when the reflow thermal treatment of the phosphorus-containing insulation layer is completed, the thickness of the nitride layer remaining in the cell region may be equal to the thickness of the nitride layer remaining in the peripheral region. Therefore, it is possible to prevent the contact-not-open phenomenon from being generated in the process of forming the contact hole in the cell region. Also, it is possible to prevent impurities (especially, boron) contained in the interlayer dielectric layer from penetrating into the substrate or gates in the peripheral region. Consequently, the deposition thickness of the initial nitride layer can be reduced, and the integration density of the semiconductor device can be increased.

While the preceding description has been given with respect to exemplary embodiments, it will be apparent to those skilled in the art that various changes and modifications may be made without departing from the spirit and scope defined in the following claims.

What is claimed is:

1. A method for fabricating an insulation layer, the method comprising:
    forming a first insulation layer over a nitride layer; and
    forming a second insulation layer over the first insulation layer,
    wherein the first and second insulation layers are formed by using a silicon source and a phosphorus source, the first insulation layer being formed by using a higher flow rate of the silicon source and a lower flow rate of the phosphorus source than used with the second insulation layer.

2. The method of claim 1, further comprising performing a reflow thermal treatment on the first and second insulation layers.

3. The method of claim 1, wherein the first and second insulation layers are formed in-situ within a common chamber.

4. The method of claim 1, wherein the content of phosphorus in the second insulation layer is larger than the content of phosphorus in the first insulation layer.

5. The method of claim 1, wherein the first insulation layer has a content of phosphorus in a range of approximately 2 wt % to approximately 3.5 wt % and is formed by using the silicon source in a range of approximately 900 mgm to approximately 2,500 mgm.

6. The method of claim 1, wherein the second insulation layer has a content of phosphorus in a range of approximately 3.5 wt % to approximately 6 wt % and is formed by using the silicon source in a range of approximately 500 mgm to approximately 900 mgm.

7. The method of claim 1, wherein the first and second insulation layers comprise a borophospho silicate glass (BPSG) layer.

8. A method for fabricating a semiconductor device, the method comprising:
   forming a plurality of patterns over a substrate;
   forming a nitride layer over a resulting structure including the patterns; and
   forming a first insulation layer having an uniform thickness over the nitride layer, and a second insulation layer filling a gap between the patterns over the first insulation layer,
   wherein the first and second insulation layers are formed by using a silicon source and a phosphorus source, the first insulation layer being formed by using a higher flow rate of the silicon source and a lower flow rate of the phosphorus source than used with the second insulation layer.

9. The method of claim 8, further comprising performing a reflow thermal treatment on the first and second insulation layers.

10. The method of claim 8, wherein the first and second insulation layers are formed in-situ within a common chamber.

11. The method of claim 8, wherein the content of phosphorus in the second insulation layer is larger than the content of phosphorus in the first insulation layer.

12. The method of claim 8, wherein the first insulation layer has a content of phosphorus in a range of approximately 2 wt % to approximately 3.5 wt % and is formed by using the silicon source in a range of approximately 900 mgm to approximately 2,500 mgm.

13. The method of claim 8, wherein the second insulation layer has the content of phosphorus in a range of approximately 3.5 wt % to approximately 6 wt % and is formed by using the silicon source in a range of approximately 500 mgm to approximately 900 mgm.

14. The method of claim 8, wherein the first and second insulation layers comprise a borophospho silicate glass (BPSG) layer.

15. The method of claim 8, wherein the patterns comprise a gate, a bit line, and a metal line.

16. A method for fabricating a semiconductor device, the method comprising:
   forming a plurality of gates over a substrate defining a cell region and a peripheral region, a gap between the gates in the cell region being greater than a gap between the gates in the peripheral region;
   forming a nitride layer over a resulting structure including the gates; and
   forming a first insulation layer over the nitride layer, and a second insulation layer filling a gap between the gates over the first insulation layer,
   wherein the first and second insulation layers are formed by using a silicon source and a phosphorus source, the first insulation layer being formed by using a higher flow rate of the silicon source and a lower flow rate of the phosphorus source than used with the second insulation layer.

17. The method of claim 16, further comprising performing a reflow thermal treatment on the first and second insulation layers.

18. The method of claim 16, further comprising selectively etching the first and second insulation layers to form a contact hole exposing the substrate of the cell region.

19. The method of claim 16, wherein the first and second insulation layers are formed in-situ within a common chamber.

20. The method of claim 16, wherein the content of phosphorus in the second insulation layer is larger than the content of phosphorus in the first insulation layer.

21. The method of claim 16, wherein the first insulation layer has a content of phosphorus in a range of approximately 2 wt % to approximately 3.5 wt % and is formed by using the silicon source in a range of approximately 900 mgm to approximately 2,500 mgm.

22. The method of claim 16, wherein the second insulation layer has a content of phosphorus in a range of approximately 3.5 wt % to approximately 6 wt % and is formed by using the silicon source in a range of approximately 500 mgm to approximately 900 mgm.

23. The method of claim 16, wherein the first and second insulation layers comprise a borophospho silicate glass (BPSG) layer.

* * * * *